(12) United States Patent
Zhu

(10) Patent No.: US 10,043,909 B2
(45) Date of Patent: Aug. 7, 2018

(54) SEMICONDUCTOR DEVICES HAVING HIGH-QUALITY EPITAXIAL LAYER AND METHODS OF MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 15/368,629

(22) Filed: Dec. 4, 2016

(65) Prior Publication Data

US 2017/0162697 A1  Jun. 8, 2017

(30) Foreign Application Priority Data

Dec. 7, 2015  (CN) .......................... 2015 1 0888884

(51) Int. Cl.
*H01L 29/78* (2006.01)
*H01L 21/762* (2006.01)
(Continued)

(52) U.S. Cl.
CPC .... *H01L 29/7853* (2013.01); *H01L 21/31111* (2013.01); *H01L 21/76224* (2013.01); *H01L 29/0649* (2013.01); *H01L 29/165* (2013.01); *H01L 29/20* (2013.01); *H01L 29/66818* (2013.01)

(58) Field of Classification Search
CPC . H01L 21/845; H01L 29/7849; H01L 29/785; H01L 29/66795; H01L 31/022425; H01L 31/0512
See application file for complete search history.

(56) References Cited

U.S. PATENT DOCUMENTS

2005/0148137 A1* 7/2005 Brask .............. H01L 21/823821
438/216
2007/0045748 A1* 3/2007 Booth, Jr. ....... H01L 21/823807
257/369
(Continued)

FOREIGN PATENT DOCUMENTS

CN          104282560 A     1/2015
WO    WO 2015/047354 A1   4/2015

*Primary Examiner* — Mohsen Ahmadi
*Assistant Examiner* — Gustavo Ramallo
(74) *Attorney, Agent, or Firm* — Christensen, Fonder, Dardi & Herbert PLLC

(57) ABSTRACT

A semiconductor device with a high-quality epitaxial layer and a method of manufacturing the same. The semiconductor device may include: a substrate; a fin-shaped first semiconductor layer spaced apart from the substrate; a second semiconductor layer at least partially surrounding a periphery of the first semiconductor layer; an isolation layer formed on the substrate, exposing at least a part of the second semiconductor layer, wherein the exposed part of the second semiconductor layer extends in a fin shape; and a gate stack formed on the isolation layer and intersecting the second semiconductor layer.

19 Claims, 14 Drawing Sheets

(51) Int. Cl.
    *H01L 29/06*     (2006.01)
    *H01L 29/165*     (2006.01)
    *H01L 29/20*     (2006.01)
    *H01L 29/66*     (2006.01)
    *H01L 21/311*     (2006.01)

(56) References Cited

U.S. PATENT DOCUMENTS

| | | | |
|---|---|---|---|
| 2009/0090934 A1* | 4/2009 | Tezuka | H01L 27/1211 257/190 |
| 2014/0151810 A1* | 6/2014 | Maeda | H01L 29/41791 257/365 |
| 2014/0357036 A1 | 12/2014 | Loubet et al. | |
| 2015/0034899 A1* | 2/2015 | Ching | H01L 29/66439 257/9 |
| 2017/0077232 A1* | 3/2017 | Balakrishnan | H01L 29/1054 |

\* cited by examiner

SEMICONDUCTOR DEVICES HAVING HIGH-QUALITY EPITAXIAL LAYER AND METHODS OF MANUFACTURING THE SAME

CROSS-REFERENCE TO RELATED APPLICATION

This application claims priority to Chinese Patent Application No. 201510888884.3, filed on Dec. 7, 2015, entitled "Semiconductor devices having high-quality epitaxial layer and methods of manufacturing the same," which is incorporated herein by reference in its entirety.

TECHNICAL FIELD

The present disclosure relates to the field of semiconductors, and particularly to semiconductor devices having a high-quality epitaxial layer and methods of manufacturing the same.

BACKGROUND

With the development of semiconductor devices, it is desirable to manufacture high-performance semiconductor devices such as Metal-Oxide-Semiconductor Field-Effect Transistors (MOSFETs) using a semiconductor material of higher mobility than that of Si. However, it is difficult to form a high-quality semiconductor material of high mobility.

SUMMARY OF THE DISCLOSURE

In view of the above, the present disclosure aims to provide, among others, a semiconductor device having a high-quality epitaxial layer and a method of manufacturing the same.

According to an aspect of the present disclosure, there is provided a semiconductor device, comprising: a substrate; a fin-shaped first semiconductor layer spaced apart from the substrate; a second semiconductor layer at least partially surrounding a periphery of the first semiconductor layer; an isolation layer formed on the substrate, exposing at least a part of the second semiconductor layer, wherein the exposed part of the second semiconductor layer extends in a fin shape; and a gate stack formed on the isolation layer and intersecting the second semiconductor layer.

According to another aspect of the present disclosure, there is provided a method of manufacturing a semiconductor device, comprising: forming a fin structure on a substrate; forming a supporting layer on the substrate having the fin structure formed thereon, and patterning the supporting layer into a supporting portion extending from a surface of the substrate to a surface of the fin structure and thereby physically connecting the fin structure to the substrate; removing a portion of the fin structure close to the substrate, to form a first semiconductor layer spaced apart from the substrate; and growing a second semiconductor layer with the first semiconductor layer as a seed layer.

According to embodiments of the present disclosure, the second semiconductor layer can be grown with the first (thin) semiconductor layer suspended relative to the substrate as a seed layer, and the second semiconductor layer can have high mobility. Such a suspended thin seed layer can enable relaxation of stresses in the first semiconductor layer and the second semiconductor layer, thereby contributing to suppress defects in the first semiconductor layer or the second semiconductor layer.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
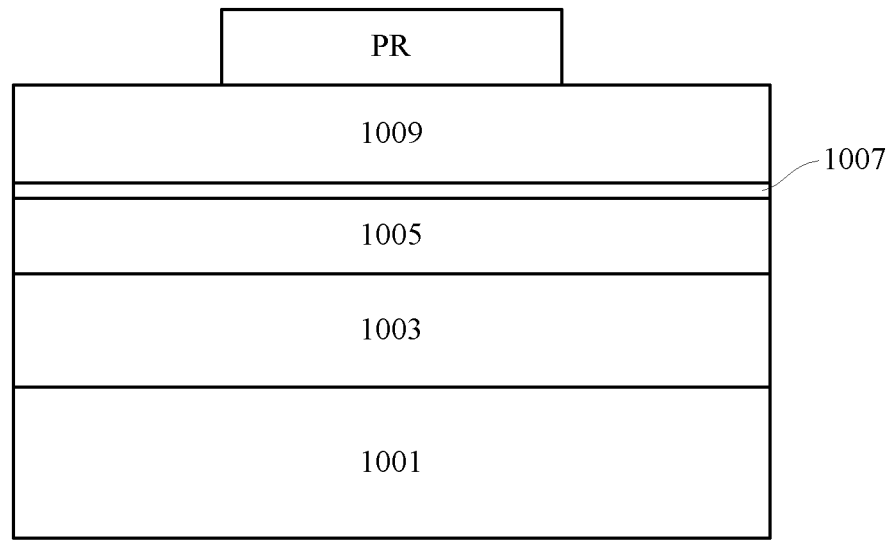
FIGS. 1-16 are views illustrating a flow of manufacturing a semiconductor device according to an embodiment of the present disclosure.

Hereinafter, embodiments of the present disclosure will be described with reference to the attached drawings. However, it should be understood that those descriptions are provided for illustrative purpose only, rather than limiting the scope of the present disclosure. Further, in the following, descriptions of known structures and techniques might be omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a semiconductor device having a suspended fin structure. In particular, the device has a fin suspended relative to a substrate. Here, the so-called "suspended" refers to that the fin is spaced apart from the substrate. It is to be noted that a spacing between the fin and the substrate may be filled with another material (for example, an isolation layer). The fin may comprise a semiconductor material of high mobility, to improve performances of the device. Here, the so-called "high mobility" refers to higher mobility than that of Si. The semiconductor material of high mobility comprises, for example, Ge, SiGe, a III-V compound semiconductor, or the like.

The fin may be a second semiconductor layer formed (for example, epitaxially) on a first semiconductor layer above the substrate and spaced apart from the substrate. The first semiconductor layer may be in a fin shape, and is suspended relative to the substrate. Then, the second semiconductor layer may be formed to at least partially surround a periphery of the first semiconductor layer, so that the second semiconductor layer is also in a fin shape and may then be used as the fin of the device. Here, the so-called "partially surround(ing)" refers to that there may be an extent of the first semiconductor layer in a longitudinal direction thereof in which the second semiconductor layer can completely enclose an external surface of the first semiconductor layer. That is, in this extent, the second semiconductor layer may form a closed pattern on a cross section perpendicular to the longitudinal direction of the first semiconductor layer, for example, a rectangle, a polygon or the like corresponding to a shape of a cross section of the first semiconductor layer. Of course, except for a surface of the first semiconductor layer covered by a supporting portion, remaining surfaces of the first semiconductor layer may also be covered by the second semiconductor layer. The first semiconductor layer may be relatively thin (for example, with a thickness of about 3-20 nm) and is suspended relative to the substrate. In this way, stresses in the first semiconductor layer and the second semiconductor layer can be relaxed in the growth process, and therefore it is possible to suppress or avoid defects occurring in the first semiconductor layer or the second semiconductor layer.

The first semiconductor layer may be physically connected to the substrate via the supporting portion and thus is supported by the substrate. An extent of a portion of the first semiconductor layer connected to the supporting portion in the longitudinal direction of the first semiconductor layer may be less than a length of the first semiconductor layer in the longitudinal direction. In this way, when only the first semiconductor layer, the substrate and the supporting portion are observed as to their positional relationship (without considering other layer structures), the first semiconductor layer is similar to a cantilever, and the supporting portion is similar to an anchor of the cantilever.

The supporting portion may comprise a laterally extending portion extending along a surface of the substrate and a vertically extending portion extending in a direction substantially perpendicular to the surface of the substrate. The vertically extending portion extends onto vertical sidewalls of the first semiconductor layer which are substantially perpendicular to the surface of the substrate. In this way, the first semiconductor layer is physically connected to the substrate via the supporting portion and thus is supported by the substrate. The vertically extending portion of the supporting portion may extend on the vertical sidewalls of the first semiconductor layer on opposite sides to sandwich the first semiconductor layer.

The supporting portion may be positioned at either one or both of opposite ends of the fin-shaped first semiconductor layer, or may be positioned in the middle of the fin-shaped first semiconductor layer.

The substrate may have an isolation layer formed thereon to electrically isolate a gate stack of the device from the substrate. The isolation layer may fill a space between the first and second semiconductor layers and the substrate, and expose at least a part of the second semiconductor layer. For example, beneath the second semiconductor layer, the isolation layer may be contiguous to the second semiconductor layer, while at remaining regions, the isolation layer may have a top surface closer to the substrate than a bottom surface of the second semiconductor layer facing the substrate. The isolation layer may have an undercut beneath the second semiconductor layer. In this way, the gate stack may be inserted into the undercut to effectively control the bottom of the gate.

The semiconductor device may be manufactured as follows, for example. Specifically, a fin structure may be formed on the substrate. Then, when a portion ("lower portion") of the fin structure close to the substrate is removed to obtain the first semiconductor layer, the first semiconductor layer can be suspended relative to the substrate.

In order to support the first semiconductor layer which is to be suspended, a supporting portion may be formed. This supporting portion may be formed as follows. Specifically, a supporting layer may be formed on the substrate with the fin structure formed thereon, and then patterned into the supporting portion which extends from a surface of the substrate to a surface of the fin structure and therefore physically connects the fin structure to the substrate. The supporting layer may be patterned with a mask. The mask extends on the fin structure beyond an extent of the fin structure in a direction perpendicular to a longitudinal direction of the fin structure (in this way, the mask can shield portions of the supporting layer extending on the surface of the substrate on opposite sides of the fin structure, so that those portions can then be remained); and the mask covers only a portion of a length of the fin structure in the longitudinal direction (in this way, the mask shields only a portion of a longitudinal extent of the fin structure, so that this portion can then be connected to the supporting portion). The mask may cover either one or both of opposite ends of the fin structure, or cover the middle of the fin structure, and the resulting supporting portion may correspondingly be positioned at either one or both of the ends of the fin structure or the middle of the fin structure.

Then, a lower portion of the fin structure may be removed. In this way, the first semiconductor layer looks like a cantilever relative to the substrate, and the supporting portion looks like an anchor of the cantilever to anchor the first semiconductor layer as a cantilever to the substrate.

In order to facilitate removal of the lower portion of the fin structure, the fin structure may comprise a stack of a sacrificial layer and the first semiconductor layer formed in sequence on the substrate. For example, the sacrificial layer and the first semiconductor layer may be formed in sequence on the substrate, and then the first semiconductor layer and the sacrificial layer may be patterned into a fin structure. The patterning step may be carried out into the substrate, so that a protrusion may be formed on the substrate at a position corresponding to the fin structure. Then, the sacrificial layer may be selectively removed.

As the first semiconductor layer is suspended and thereby surfaces thereof are exposed, a second semiconductor layer may be grown on the surfaces. Then, in a case of sufficient growth, all of the surfaces of the first semiconductor layer (exposed by the supporting portion) may be covered by the second semiconductor layer. This second semiconductor layer may extend in a fin shape as the first semiconductor layer, and may then act as a fin of the device.

There are various ways to manufacture the device based on the fin. For example, an isolation layer may be formed on the substrate, and a gate stack intersecting the second semiconductor layer may be formed on the isolation layer. The isolation layer may fill a space between the first and second semiconductor layers and the substrate, and expose at least a part of the second semiconductor layer. The isolation layer may be formed by depositing a dielectric layer such as an oxide layer and then etching it back. The supporting portion may have a different material from that of the isolation layer, and thus will not be damaged during the back etching. The isolation layer may be etched so that the isolation layer is contiguous to the second semiconductor layer beneath the second semiconductor layer, while has a top surface closer to the substrate than a bottom surface of the second semiconductor layer facing the substrate in remaining regions. Further, during the back etching, an undercut may be formed beneath the second semiconductor layer.

The present disclosure may be implemented in various forms, and some examples thereof will be described below.

As shown in FIG. 1, a substrate 1001 is provided. The substrate 1001 may be a substrate in any form, for example, but not limited to, a bulk semiconductor substrate such as a bulk silicon (Si) substrate or the like. Hereinafter, the bulk Si substrate will be described by way of example for convenience of description. Particularly, the substrate 1001 may comprise monocrystalline Si, and have a surface of, for example, a (110) crystal plane, a (100) crystal plane, or a (112) crystal plane.

A sacrificial layer 1003 and a first semiconductor layer 1005 are formed in sequence on the substrate 1001 by, for example, epitaxy. The sacrificial layer 1003 may comprise a different semiconductor material from those of the substrate 1001 and the first semiconductor layer 1005, for example, SiGe (wherein Ge may have an atomic percentage of, for example, about 5-20%), with a thickness of about 10-100 nm. The first semiconductor layer 1005 may comprise a suitable semiconductor material, for example, Si, with a thickness of about 10-100 nm.

Then, the first semiconductor layer 1005 and the sacrificial layer 1003 (and optionally, the substrate 1001) which are formed in such a way may be patterned to form a fin structure. For example, this can be done as follows.

Specifically, a hard mask layer may be formed on the first semiconductor layer 1005. In this example, the hard mask layer may comprise an oxide (for example, silicon oxide) layer 1007 and a polysilicon layer 1009. For example, the oxide layer 1007 has a thickness of about 2-10 nm, and the polysilicon layer 1009 has a thickness of about 50-120 nm. In this example, the hard mask is patterned into a fin shape using a pattern transfer technology. To this end, a patterned (for example, through exposure and development) photoresist PR may be formed on the hard mask layer. Here, the photoresist PR is patterned into a strip extending perpendicularly to the sheet, and a width thereof (a dimension in a horizontal direction in the figure) may approximately correspond to a spacing between two fin structures.

Figure 2:
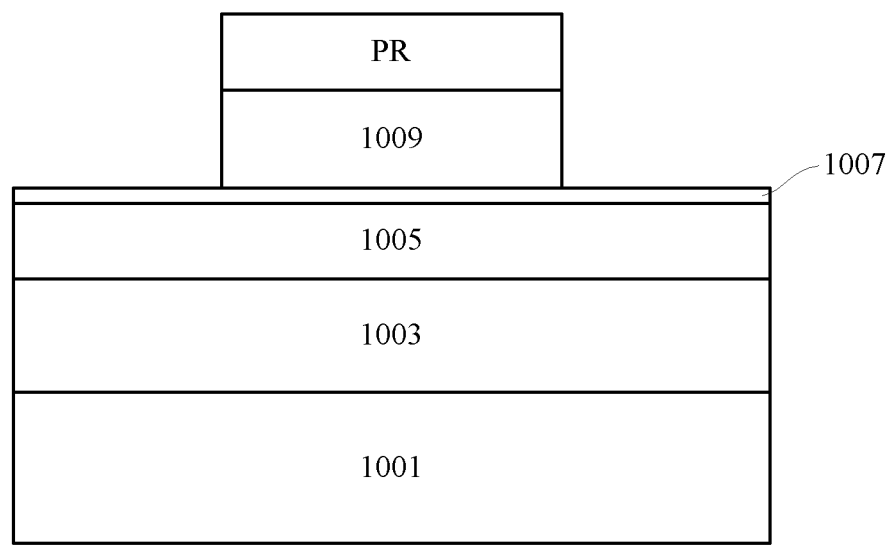
Figure 3A:
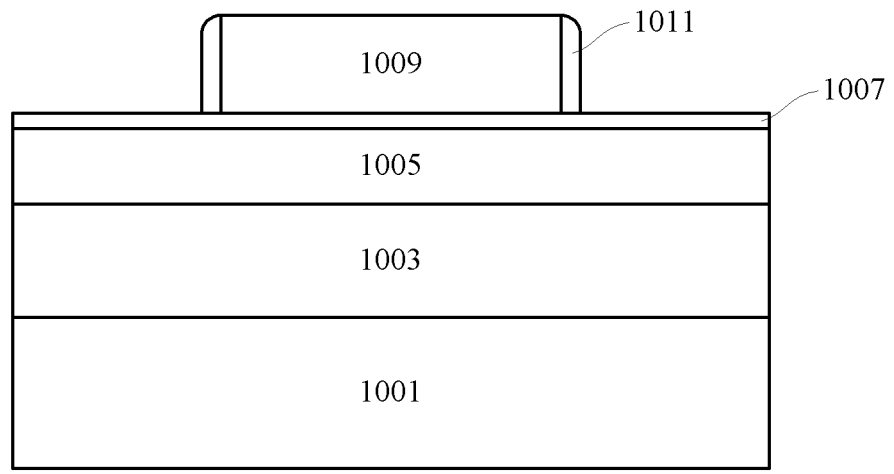

Next, as shown in FIG. 2, the polysilicon layer 1009 is selectively etched (relative to the oxide layer 1007) by, for example, Reactive Ion Etching (RIE) with the photoresist PR as a mask. In this way, the polysilicon layer 1009 may be patterned into a strip corresponding to the photoresist PR. Then, as shown in FIG. 3(a), the photoresist PR is removed and a spacer 1011 is formed on sidewalls of the polysilicon layer 1009. There are various ways in the art to form the spacer. For example, a nitride (for example, silicon nitride) layer with a thickness of about 3-20 nm may be deposited in a substantially conformal way by, for example, Atomic Layer Deposition (ALD), and then the deposited nitride layer may be selectively etched by, for example, RIE, to remove a laterally extending portion thereof so that a vertically extending portion thereof is remained to form the spacer 1011. The spacer 1011 covers the sidewalls of the Si layer 1009.

Figure 3B:
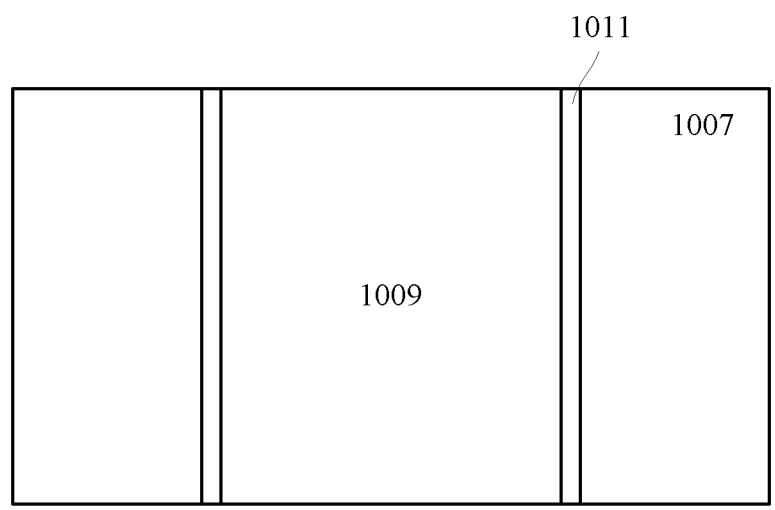

FIG. 3(b) is a top view of the structure illustrated in FIG. 3(a). It is to be noted that although not shown in FIG. 3(b), the spacer 1011 also exists on upper and lower sidewalls of the strip-shaped polysilicon layer 1009, and thereby the spacer 1011 forms a closed pattern surrounding the periphery of the strip-shaped polysilicon layer 1009.

Figure 4A:
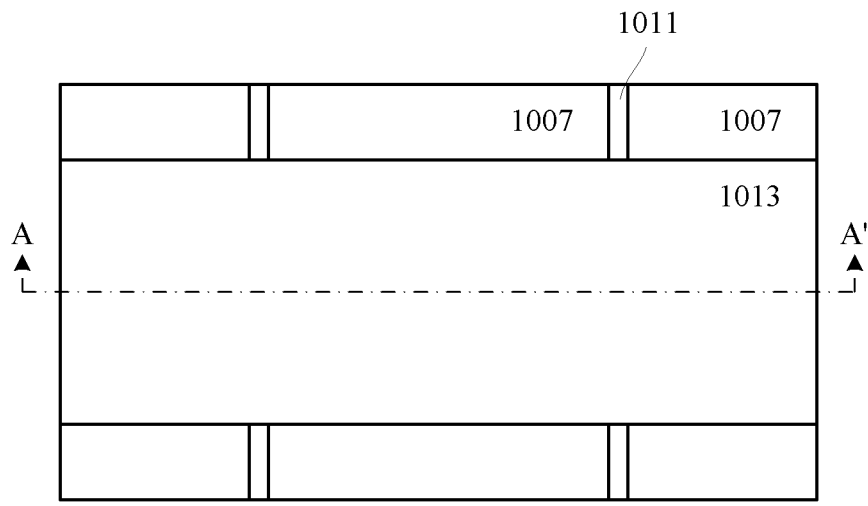
Figure 4B:
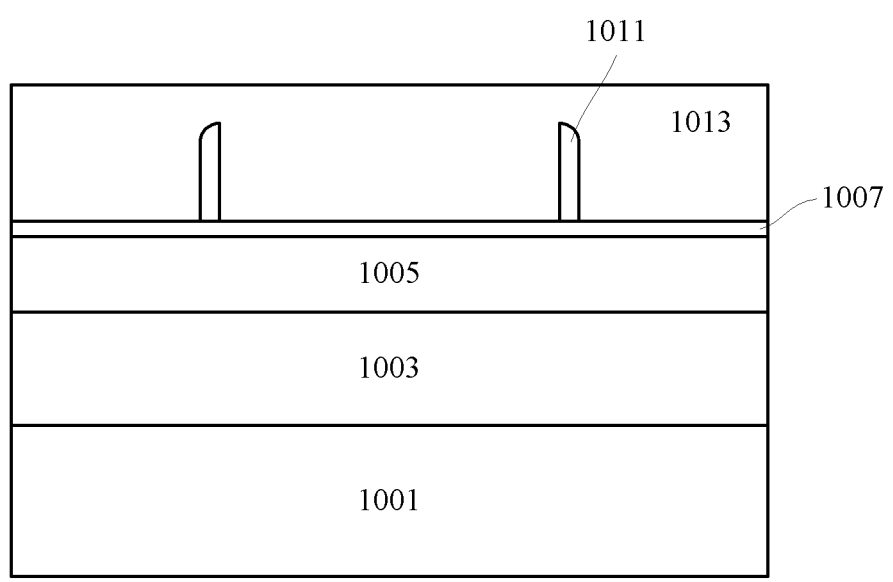
Figure 5:
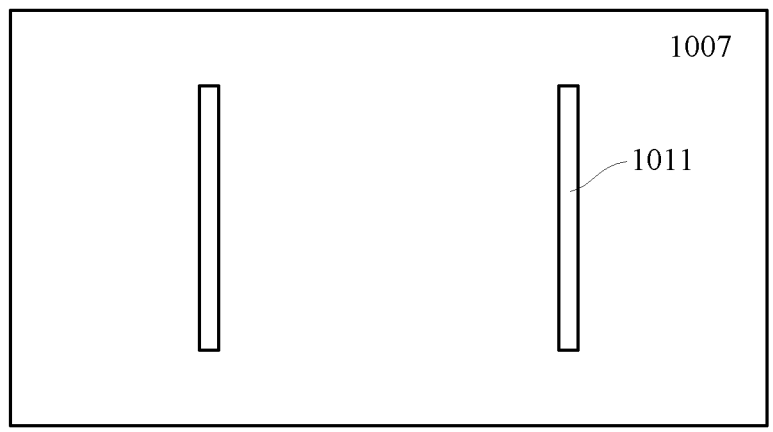

In order to obtain a fin-shaped mask, as shown in FIGS. 4(a) and 4(b) (FIG. 4(a) is a top view, and FIG. 4(b) is a sectional view along line AA' in FIG. 4(a)), the polysilicon layer 1009 may be selectively removed (by, for example, a Tetramethylammonium hydroxide (TMAH) solution), and then a patterned photoresist 1013 is formed. The photoresist 1013 may shield the middle of the spacer 1011, and expose upper and lower portions of the spacer 1011. The spacer 1011 is selectively etched by, for example, RIE, with the photoresist 1013 as a mask, so that the spacer 1011 which is originally in a closed pattern can be separated into two portions, as shown in FIG. 5. Each portion corresponds to a fin structured to be formed, which in this example is a strip extending in a vertical direction in the figure.

Figure 6:
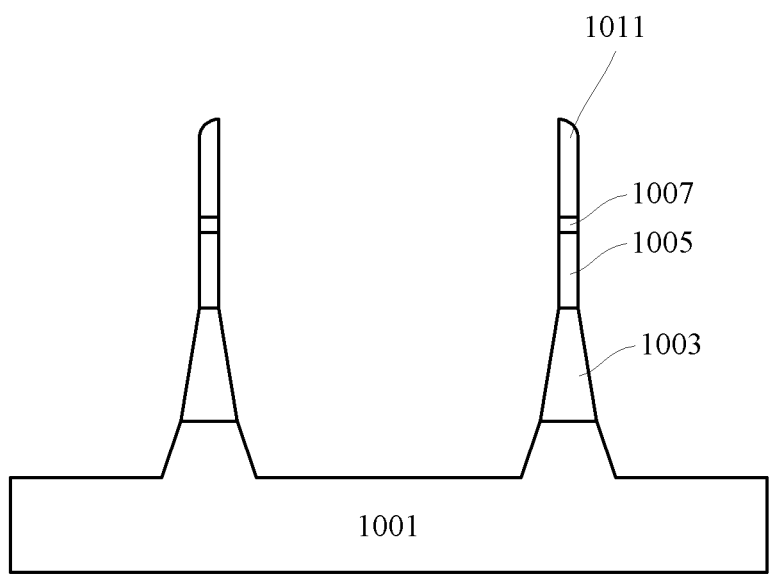

Then, as shown in FIG. 6, the oxide layer 1007, the first semiconductor layer 1005 and the sacrificial layer 1003 may be selectively etched in sequence by, for example, RIE, with the spacer 1011 as a mask. In this way, the pattern of the spacer 1011 is transferred into the underlying layers, resulting in the fin structure. Therefore, the first semiconductor layer 1005 has a width (a dimension in a horizontal direction in the figure) which is approximately the same as that of the spacer 1011 (for example, about 3-20 nm). Here, the substrate 1001 may be further selectively etched. Therefore, the substrate 1001 may have a protrusion thereon at a position corresponding to the fin structure. The fin structure has a projection on the substrate at approximately the middle of the protrusion. Due to characteristics of etching, the etched sacrificial layer 1003 and the protrusion of the substrate 1001 each may have a shape increasingly enlarged from top down. Then, the spacer 1011 may be selectively removed (and the oxide layer 1007 may be further selectively removed).

Although the fin structure is formed by using the pattern transfer technology as described above, the present disclosure is not limited thereto. For example, fin-shaped photoresist may be formed directly on the first semiconductor layer 1005, and the first semiconductor layer 1005, the sacrificial layer 1003 and the substrate 1001 can be selectively etched with the photoresist as a mask to form a fin structure. Alternatively, fin-shaped photoresist may be formed directly on the hard mask layer, the hard mask layer can be patterned into a fin shape by using the photoresist, and the first semiconductor layer 1005, the sacrificial layer 1003 and the substrate 1001 can be selectively etched in sequence with the fin-shaped hard mask layer to form a fin structure.

Here, although two fin structures are illustrated, the present disclosure is not limited thereto. For example, more or less fin structures may be formed. Further, a layout of the fin structures may be differently designed according to requirements for the device.

Figure 7:
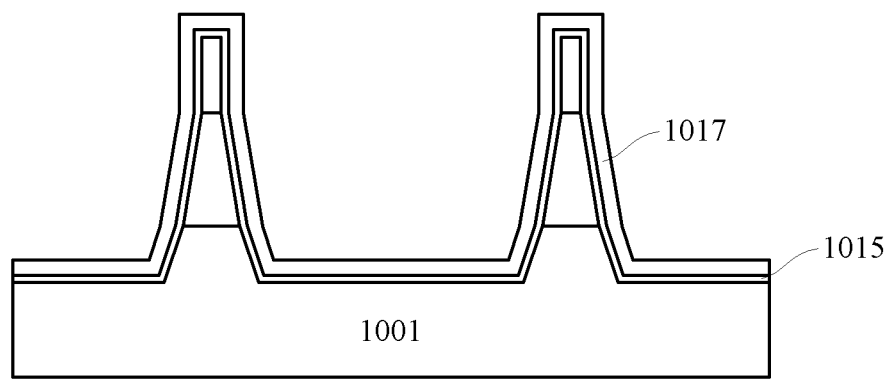

After the fin structure is formed, a supporting portion may be formed. For example, as shown in FIG. 7, an oxide layer 1015 and a nitride layer 1017 may be formed by, for example, ALD in an approximately conformal way on the substrate with the fin structure formed thereon. The oxide layer 1015 may have a thickness of about 1-10 nm, and the nitride layer 1017 may have a thickness of about 2-15 nm. Then, as illustrated in the top view of FIG. 8, patterned photoresist 1019 may be formed on the structure illustrated in FIG. 7. The photoresist 1019 is patterned to cover an end (lower end in the figure) of the fin structure and extend in a horizontal direction in the figure. It is to be noted that in the top view of FIG. 8, the topography of the nitride layer 1017 which fluctuates along with the fin structure on the substrate is not shown merely for convenience, and the same is true for the following top views.

Figure 9A:
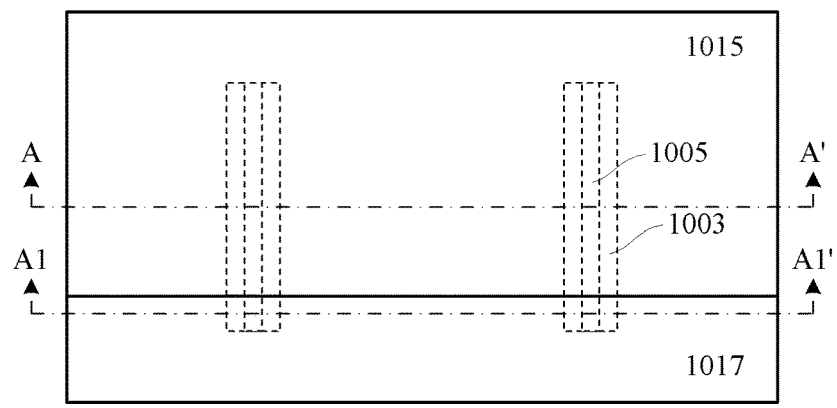
Figure 9B:
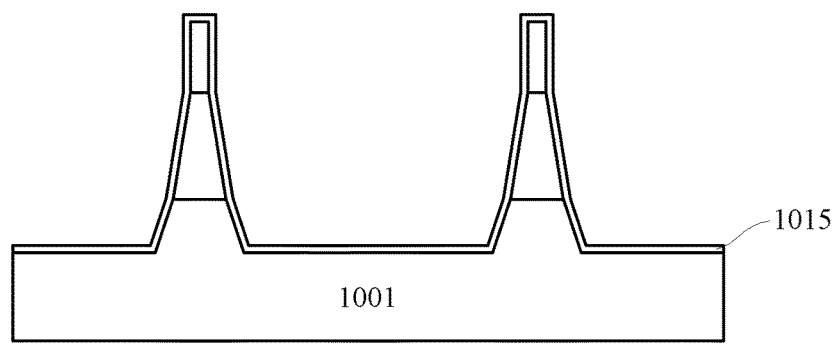
Figure 9C:
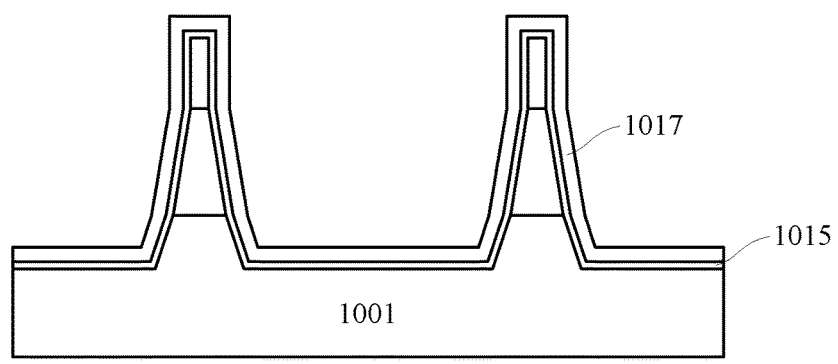

Then, as shown in FIGS. 9(a), 9(b) and 9(c) (FIG. 9(a) is a top view, FIG. 9(b) is a sectional view along line AA' in FIG. 9(a), and FIG. 9(c) is a sectional view along line A1A1' in FIG. 9(a)), the nitride layer 1017 is selectively removed by, for example, RIE (relative to the oxide layer 1015) with the photoresist 1019 as a mask. In this way, as shown in FIG. 9(c), the nitride layer 1017 is remained on an end (lower end in the figure) of the fin structure and extends onto the surface of the substrate 1001. In this way, the fin structure is physically connected to the substrate 1001 by the nitride layer 1017, and thus can be supported by the substrate 1001 (particularly after the sacrificial layer 1003 is removed as described below). Then, the photoresist 1019 may be removed.

In the embodiment, a supporting layer which is a stack of the oxide layer and the nitride layer is formed, and the supporting layer is patterned into a supporting portion. However, the present disclosure is not limited thereto. The supporting layer may comprise various suitable dielectric materials. In an embodiment in which the supporting portion is subsequently removed, the supporting layer may even comprise a semiconductor material or a conductive material.

Figure 10:
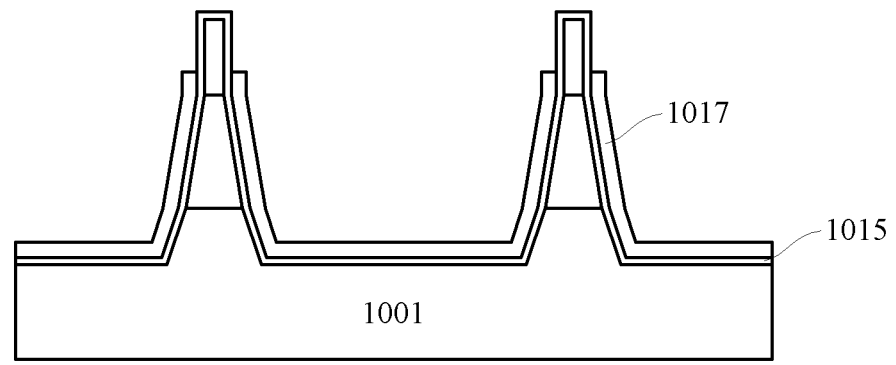

In addition, as shown in FIG. 10 (a sectional view corresponding to that of FIG. 9(c)), a top portion of the nitride layer 1017 may be selectively removed by, for example, RIE (relative to the oxide layer 1015). However, there is still a portion of the nitride layer 1017 remained on sidewalls of the first semiconductor layer 1005, so as to support the first semiconductor layer 1005.

Figure 11A:
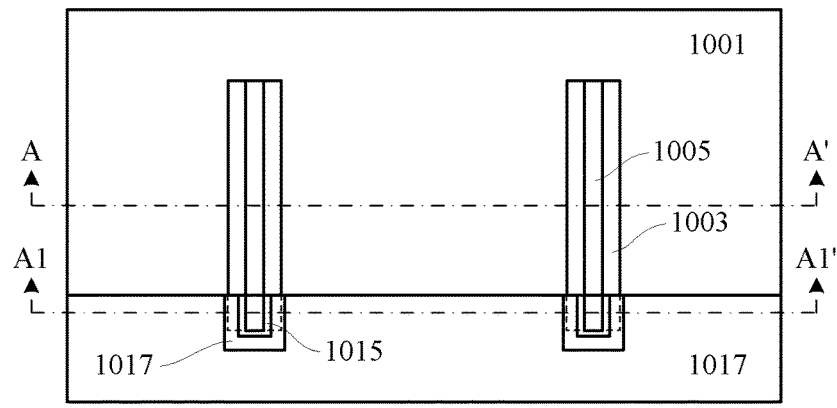
Figure 11B:
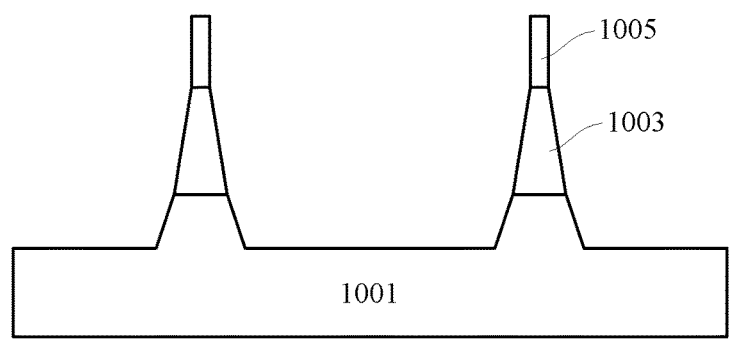
Figure 11C:
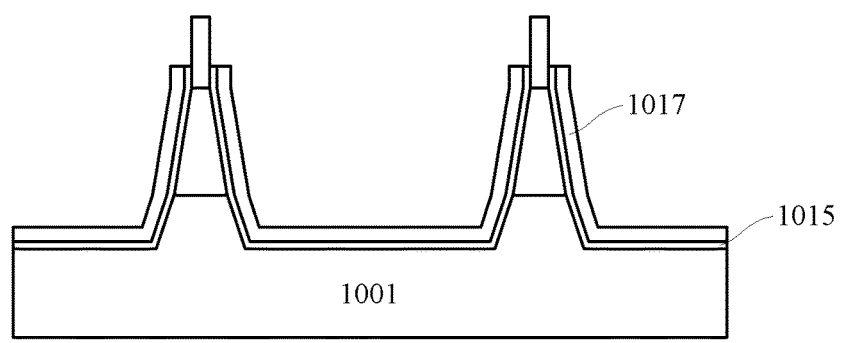
Figure 12A:
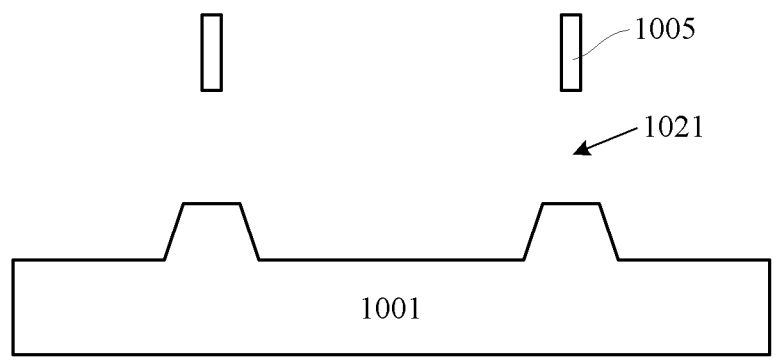
Figure 12B:
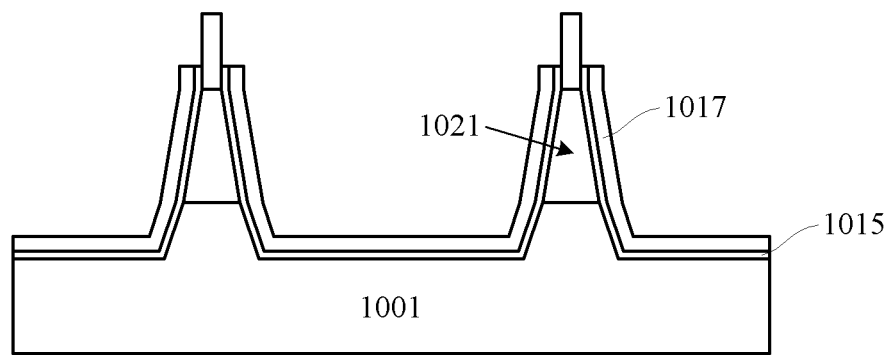

Then, as shown in FIGS. 11(a), 11(b) and 11(c) (FIG. 11(a) is a top view, FIG. 11(b) is a sectional view along line AA' in FIG. 11(a), and FIG. 11(c) is a sectional view along line A1A1' in FIG. 11(a)), the oxide layer 1015 may be selectively removed by, for example, RIE (relative to the substrate 1001 and the first semiconductor layer 1005 of Si and the sacrificial layer 1003 of SiGe). As shown in FIGS. 11(a) and 11(c), the oxide layer 1015 is covered by the nitride layer 1017 and thus can be remained on the lower end of the fin structure. Then, as shown in FIGS. 12(a) and 12(b) (sectional views corresponding to those of FIGS. 11(b) and 11(c), respectively), the sacrificial layer 1003 may be selectively removed by, for example, wet etching (relative to the substrate 1001 and the first semiconductor layer 1005 of Si). In this way, a spacing 1021 between the fin-shaped first semiconductor layer 1005 and the substrate 1001 is formed.

Figure 13:
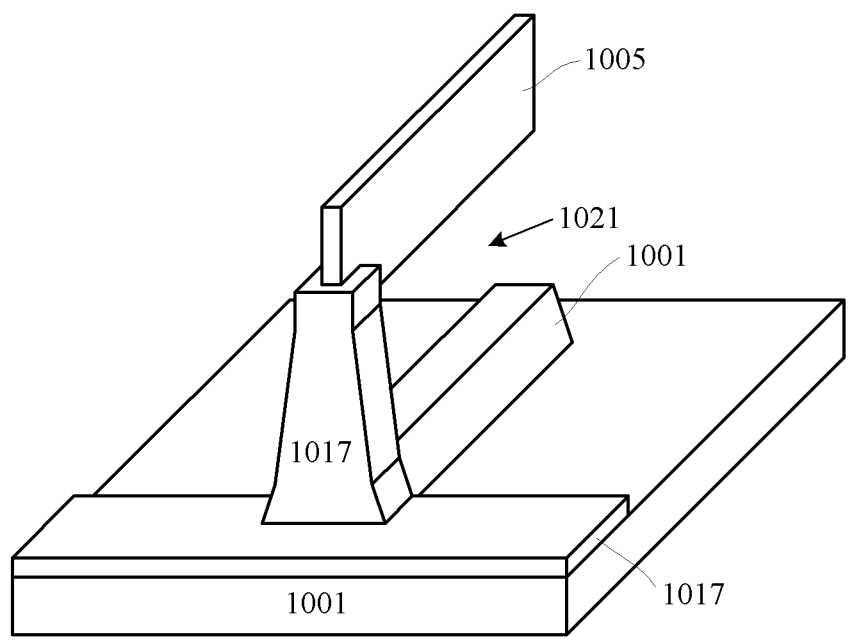

FIG. 13 is a perspective view of the structure illustrated in FIG. 12. As shown in FIG. 13, the first semiconductor layer 1005 is spaced apart from the substrate 1001 by the spacing 1021, extends approximately in parallel to the surface of the substrate, and is supported by the substrate 1001 through the supporting portion 1015/1017. For example, when the surface of the substrate is a (110) crystal plane, the first semiconductor layer 1005 may have an extending direction parallel to an intersection line between a (110) crystal plane and a (1-11) crystal plane, or an intersection line between a (110) crystal plane and a (1-1-1) crystal plane, or an intersection line between a (110) crystal plane and a (-111) crystal plane, and may have a side surface approximately parallel to a (111) crystal plane family. Alternatively, when the surface of the substrate is a (112) crystal plane, the first semiconductor layer 1005 may have an extending direction parallel to an intersection line between a (112) crystal plane and a (-1-11) crystal plane, or an intersection line between a (112) crystal plane and a (11-1) crystal plane, and may have a side surface also approximately parallel to the (111) crystal plane family. Alternatively, the first semiconductor layer 1005 may have an extending direction corresponding to a <110> direction, and may have a side surface approximately parallel to a (110) crystal plane when the surface of the substrate is a (100) crystal plane. These crystal planes tend to reduce growth defects.

In FIG. 13, merely for convenience, only one single first semiconductor layer 1005 and the corresponding supporting portion are illustrated, and the residual oxide layer 1015 is not shown.

The supporting portion 1015/1017 comprises a laterally extending portion which extends on the surface of the substrate 1001 and a vertically extending portion which extends in a direction approximately perpendicular to the surface of the substrate. In this example, the vertically extending portion may comprise a portion extending along surfaces of the protrusion of the substrate 1001, a portion extending along surfaces of the sacrificial layer 1003 (which have been removed) and also a portion extending along the vertical sidewalls of the first semiconductor layer 1005. In this way, the supporting portion 1015/1017 physically connects the first semiconductor layer 1005 to the substrate 1001, and thus can support the first semiconductor layer 1005. The supporting portion 1015/1017 may extend on the vertical sidewalls of the first semiconductor layer 1005 on two opposite sides (left side and right side in the figure), so as to sandwich the first semiconductor layer, thereby more stably supporting the first semiconductor layer 1005. Of course, in this example, the supporting portion 1015/1017 may further extend on an end of the first semiconductor layer 1005 facing the reader. An extent of a portion of the first semiconductor layer 1005 connected to the supporting portion 1015/1017 in a longitudinal direction of the first semiconductor layer 1005 is less than a length of the first semiconductor layer 1005 in the longitudinal direction. Here, the so-called "longitudinal direction" refers to a length direction of the first semiconductor layer 1005 (a direction perpendicular to the sheet in FIG. 12), which is substantially the same as a length direction of a channel which is then formed. In this way, the first semiconductor layer 1005 looks like a cantilever relative to the substrate 1001, and the cantilever is anchored to the substrate 1001 by the supporting portion 1015/1017.

In the above example, in addition to the nitride layer 1017, the supporting portion further comprises the oxide layer 1015. However, the present disclosure is not limited thereto. For example, in the operation described above in conjunction with FIG. 7, the oxide layer 1015 may not be formed, and instead, the nitride layer 1017 is directly formed. In this way, subsequent operations may also be implemented in the manner described above in conjunction with FIGS. 8-12. Of course, the supporting portion may also comprise other dielectric material or a different stack.

In addition, in the above example, for the two fin structures, the supporting portions are formed on their respective lower ends. However, the present disclosure is not limited thereto. For example, for one fin structure, the supporting portion may be formed on its lower end as described above; while for the other fin structure, the supporting portion may be formed at a different position, for example, on its upper end, as described below.

Figure 8:
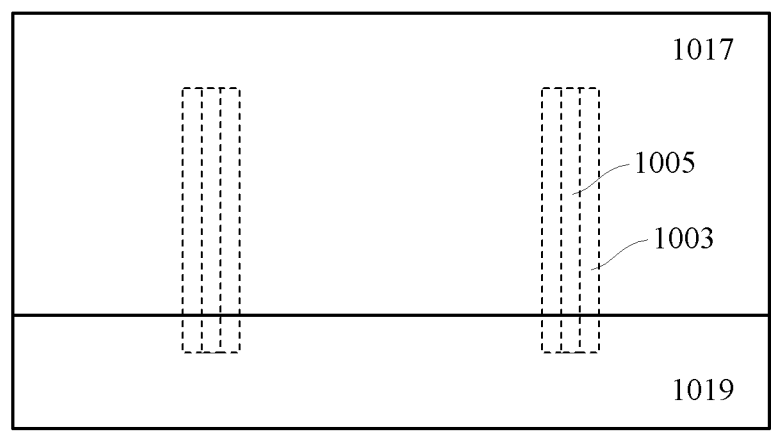

In addition, the mask 1019 which is used to pattern the supporting portion (as shown in FIG. 8) is not limited to the above shape. Generally, the mask may extend on the fin structure beyond an extent of the fin structure in a direction perpendicular to a longitudinal direction of the fin structure. In this way, the mask may cover a portion of the nitride layer 1017 extending on the surface of the substrate 1001 (except for the protrusion), and thus this portion can then be remained (as a base of the supporting portion). On the other hand, the mask may cover only a portion of the fin structure in the longitudinal direction. In this way, a configuration similar to a cantilever-anchor structure may be formed.

Figure 14A:
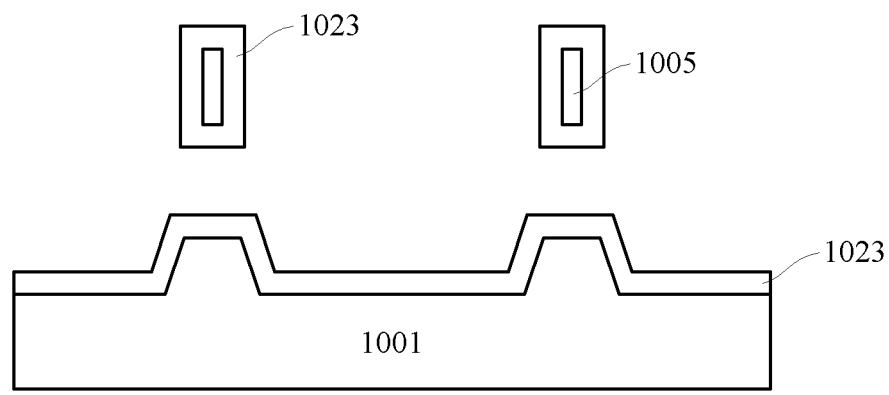
Figure 14B:
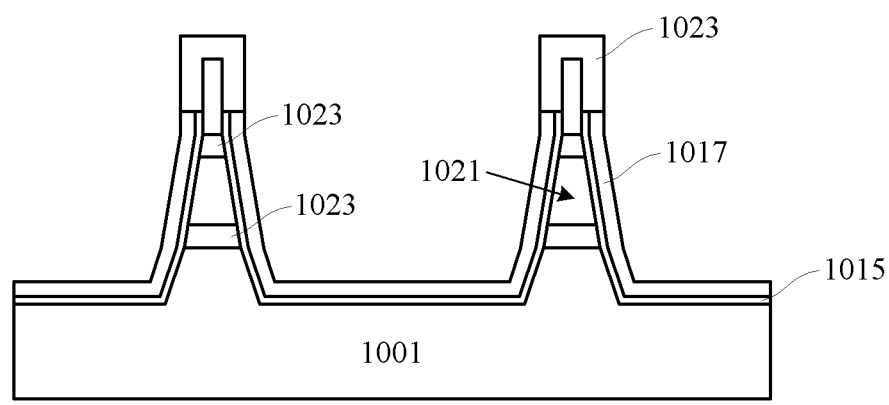

Then, as shown in FIGS. 14(*a*) and 14(*b*) (sectional views corresponding to those of FIGS. 12(*a*) and 12(*b*), respectively), a second semiconductor layer 1023 may be grown on the first semiconductor layer 1005. Here, the second semiconductor layer 1023 may comprise a material of high mobility, for example, Ge, SiGe, or a III-V compound semiconductor, such as InSb, InGaSb, InAs, GaAs, InGaAs, AlSb, InP, group-III nitride or the like, with a thickness of about 5-15 nm. In a case of the compound semiconductor such as SiGe, components thereof (for example, an atomic percentage of Ge) may change gradually, so that the compound semiconductor has a lattice constant which changes from being similar to a lattice constant of the first semiconductor layer 1005 (here, Si) to being more different from the lattice constant of the first semiconductor layer 1005, to suppress dislocations or defects. The second semiconductor layer 1023 may have a side surface approximately parallel to a (111) crystal plane family or a (110) crystal plane family of the substrate.

The growth may be selective growth, so that the second semiconductor layer 1023 is grown only on the surfaces of the first semiconductor layer 1005 (and also the substrate 1001) of the semiconductor material. The growth of the second semiconductor layer 1023 may be controlled so that the second semiconductor layer 1023 does not completely fill the spacing 1021 between the first semiconductor layer 1005 and the substrate 1001. Due to the suspension construction of the first semiconductor layer 1005, stresses in the first semiconductor layer 1005 and the second semiconductor layer 1023 can be relaxed in the growth process. In this way, it is possible to suppress or even avoid defects occurring in the first semiconductor layer 1005 or the second semiconductor layer 1023, which contributes to improve performances of the device (for example, reduce an off-state leakage current or increase an on-state current).

In this example, except for a surface of the first semiconductor layer 1005 covered by the supporting portion 1015/1017, remaining surfaces of the first semiconductor layer 1005 are covered by the second semiconductor layer. Of course, the second semiconductor layer 1023 may also be grown on the surface of the substrate 1001.

In this example, the periphery of the first semiconductor layer 1005 is completely encapsulated by the second semiconductor layer 1023 in a longitudinal range thereof in the longitudinal direction of the first semiconductor layer which is not occupied by the supporting portion. In this way, in a cross section (i.e., the cross section illustrated in FIGS. 14(*a*) and 14(*b*)) perpendicular to the longitudinal direction of the first semiconductor layer 1005, the second semiconductor layer 1023 forms a closed pattern (which is a rectangle in this example). Of course, the closed pattern is decided by a pattern of the first semiconductor layer 1005 in the cross section, and may be in a different shape such as a polygon.

The second semiconductor layer 1023 in such a shape can act as a fin of the device.

After the fin 1023 is formed in the above processes, a gate stack intersecting the fin may be formed, resulting in the final semiconductor device (for example, FinFET).

Figure 15A:
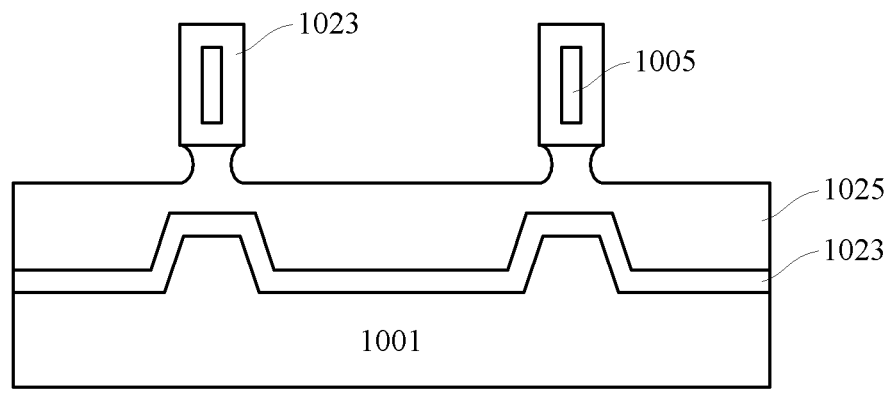
Figure 15B:
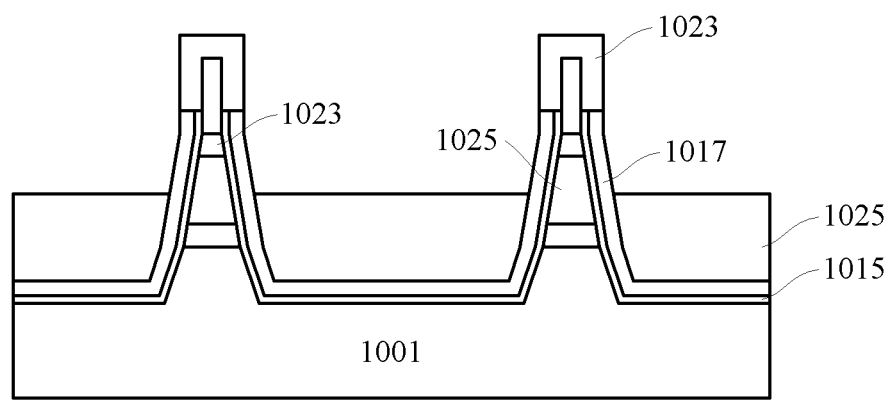

In order to isolate the gate stack from the substrate, as shown in FIGS. 15(*a*) and 15(*b*) (sectional views corresponding to those of FIGS. 14(*a*) and 14(*b*), respectively), an isolation layer 1025 is firstly formed on the substrate 1001 (in this example, on the second semiconductor layer 1023 formed on the substrate 1001). This isolation layer may be formed by, for example, depositing a dielectric material such as oxide on the substrate and then etching it back. In the back-etching process, a back-etching depth is controlled so that the resultant isolation layer 1025 can expose at least a part of the second semiconductor layer 1023. Further, the isolation layer 1025 also fills the spacing 1021. In this example, beneath the second semiconductor layer 1023, the isolation layer 1025 is contiguous to the second semiconductor layer 1023; while in remaining regions, the isolation layer 1025 has a top surface lower than a bottom surface of the second semiconductor layer 1023. Further, the isolation layer 1025 may have an undercut (due to the back etching) formed beneath the second semiconductor layer 1023.

In this embodiment, the isolation layer 1025 substantially completely fills a space between the first semiconductor layer 1005, the second semiconductor layer 1023 and the substrate 1001. However, the present disclosure is not limited thereto. For example, the top surface of the isolation layer 1025 may be spaced apart from the bottom surface of the second semiconductor layer 1023.

Figure 16:
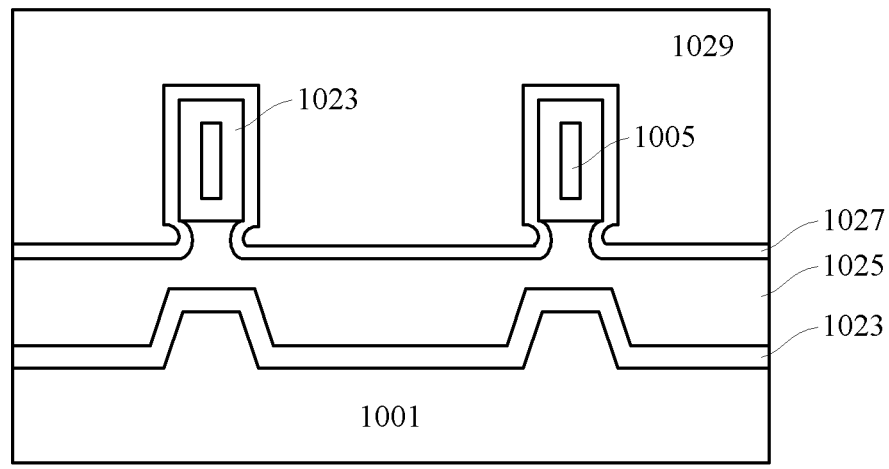

Then, the gate stack intersecting the fin may be formed on the isolation layer 1025. For example, this may be down as follows. Specifically, as shown in FIG. 16 (a sectional view corresponding to that of FIG. 15(*a*)), a gate dielectric layer 1027 and a gate conductor layer 1029 may be formed in sequence. For example, the gate dielectric layer 1027 may comprise oxide (for example, $SiO_2$ or $GeO_2$) with a thickness of about 0.3-2 nm, and the gate conductor layer 1029 may comprise polysilicon. Alternatively, the gate dielectric layer 1027 may comprise a high-K gate dielectric such as $HfO_2$ or $Al_2O_3$ with a thickness of about 1-4 nm, and the gate conductor layer 1029 may comprise a metallic gate conductor. In a case of high-K gate dielectric/metallic gate conductor, a work function adjustment layer (not shown), for example, TiN, Al, Ti, TiAlC, with a thickness of about 1-3 nm may be further formed between the gate dielectric layer 1027 and the gate conductor layer 1029.

In this example, gate stacks of two devices corresponding to the two fins are shown to have the same configuration and extend as a whole, merely for convenience of illustration. However, the present disclosure is not limited thereto. The devices may have different gate stack configurations (for example, a gate stack of an n-type device may be different from a gate stack of a p-type device), and respective gate stacks may be patterned according to a layout of the devices.

After the gate stack is formed, halo implantation and extension implantation may be performed with the gate stack as a mask, for example. Next, a gate spacer may be formed on sidewalls of the gate stack. Then, source/drain (S/D) implantation may be performed with the gate stack and the gate spacer as a mask. Then, implanted ions may be activated through annealing to form source/drain regions.

There are various ways to manufacture a device based on a fin, and processes after formation of the fin will not be described in detail here.

In this way, the semiconductor device according to the embodiment is obtained. As shown in FIG. 16, the semiconductor device may comprise the first semiconductor layer 1005 spaced apart from the substrate 1001 but physically connected to the substrate 1001 through the supporting portion 1015/1017 (as shown in FIG. 13). The second semiconductor layer 1023 is formed to surround the periphery of the first semiconductor layer 1005 and acts as a fin of the device. In addition, the device further comprises the isolation layer 1025 and the gate stack (1027, 1029) formed on the isolation layer 1025 and intersecting the fin 1023. Due to the undercut of the isolation layer 1025, the gate stack can be inserted into the undercut so as to more effectively control the bottom of the fin 1023.

In the embodiment, in the final device, the supporting portion is remained. However, the present disclosure is not limited thereto. The supporting portion may be selectively (at least partially) removed (for example, after the gate stack is formed), and a space resulting from the removal of the supporting portion may be filled with, for example, another dielectric layer.

Figure 17:
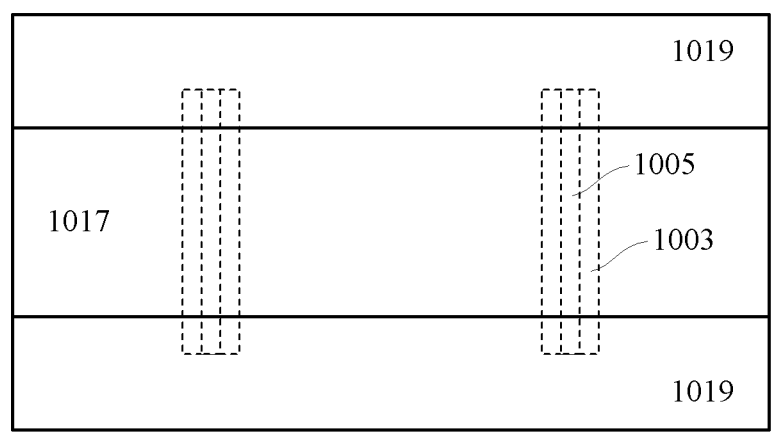
FIGS. 17-18 are views illustrating some steps in a flow of manufacturing a semiconductor device according to a further embodiment of the present disclosure.
Figure 18:
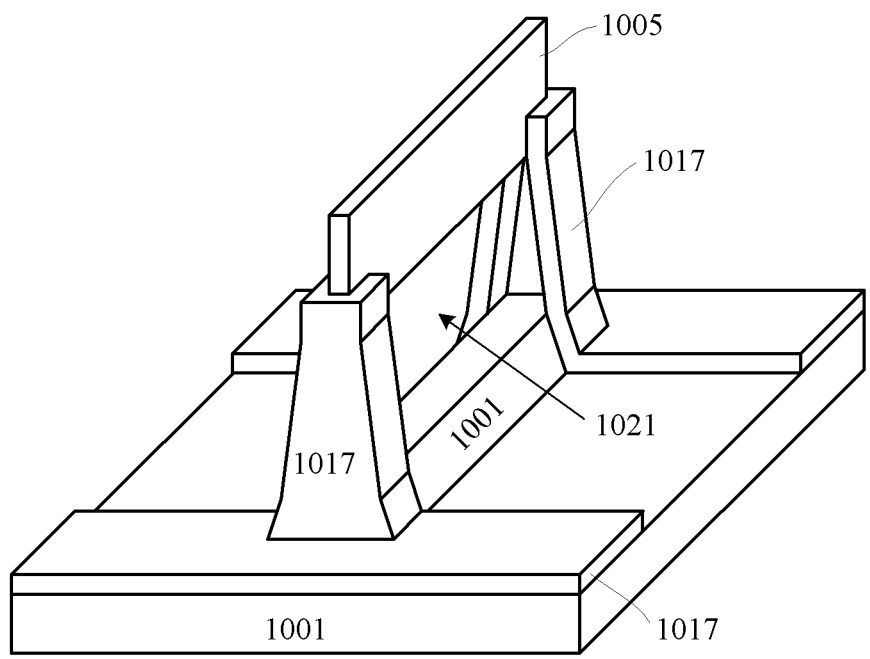

In the above embodiment, the supporting portion is formed only on one end of the first semiconductor layer. However, the present disclosure is not limited thereto, and the supporting portion may be formed on opposite ends of the first semiconductor layer, respectively. For example, instead of the operation described above in conjunction with FIG. 8, as shown in FIG. 17, the photoresist 1019 is patterned to cover opposite ends (upper and lower ends in the figure) of the fin structure, and extend in a horizontal direction in the figure. Subsequent operations may be performed in the same manner as described above. In this case, a suspension structure illustrated in FIG. 18 may be obtained. In particular, as shown in FIG. 18, the first semiconductor layer 1005 is suspended relative to the substrate 1001, and the opposite ends of the first semiconductor layer 1005 are supported by the substrate 1001 through the supporting portion 1017.

Figure 19:
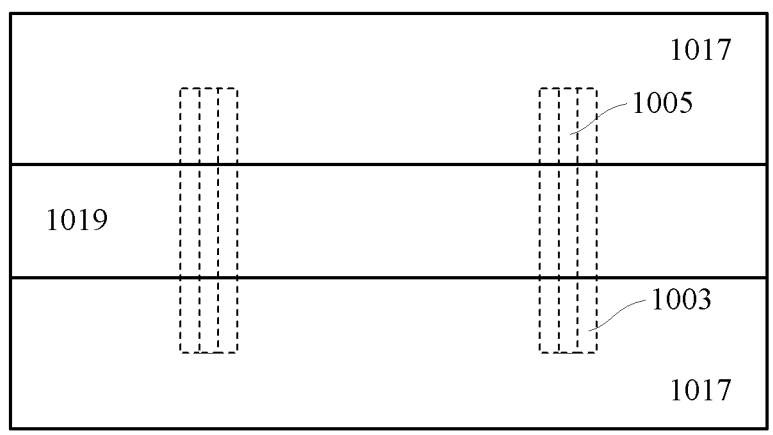
FIGS. 19-20 are views illustrating some steps in a flow of manufacturing a semiconductor device according to a still further embodiment of the present disclosure.
Figure 20:
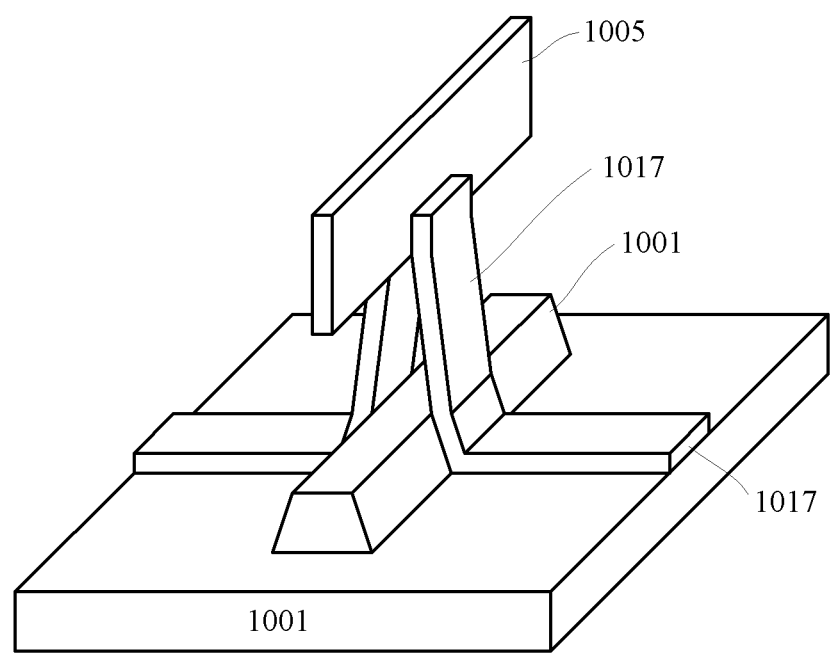

Of course, the supporting portion is not limited to be formed on the end(s) of the first semiconductor layer, and may be formed at any position in the longitudinal extent of the first semiconductor layer. For example, instead of the operation described above in conjunction with FIG. 8, as shown in FIG. 19, the photoresist 1019 is patterned to cover the middle of the fin structure, and extend in a horizontal direction in the figure. Subsequent operations may be performed in the same manner as described above. In this case, a suspension structure illustrated in FIG. 20 may be obtained. In particular, as shown in FIG. 20, the first semiconductor layer 1005 is suspended relative to the substrate 1001, and the middle of the first semiconductor layer 1005 is supported by the substrate 1001 through the supporting portion 1017.

The semiconductor devices according to the embodiments of the present disclosure are applicable to various electronic devices. For example, an Integrated Circuit (IC) may be formed by integrating a plurality of such semiconductor devices and other devices (for example, transistors in other forms or the like), from which an electronic device may be made. Therefore, the present disclosure further provides an electronic device comprising the above semiconductor device. The electronic device may also comprise components such as a display operatively coupled to the integrated circuit and a wireless transceiver operatively coupled to the integrated circuit, or the like. Such an electronic device may comprise, for example, a smart phone, a tablet Personal Computer (PC), a Personal Digital Assistant (PDA), or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided only for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

I claim:

1. A semiconductor device, comprising:
a substrate;
a fin-shaped first semiconductor layer spaced apart from the substrate;
a second semiconductor layer enclosing peripheral surfaces of the first semiconductor layer in at least a partial range of the first semiconductor layer in a longitudinal direction of the first semiconductor layer;
an isolation layer formed on the substrate, wherein at least a part of the second semiconductor layer protrudes with respect to the isolation layer and extends in a fin shape; and
a gate stack formed on the isolation layer and intersecting the second semiconductor layer.

2. The semiconductor device according to claim 1, wherein the second semiconductor layer is interposed between the first semiconductor layer and the gate stack.

3. The semiconductor device according to claim 1, further comprising: a supporting portion through which the first semiconductor layer is physically connected to the substrate.

4. The semiconductor device according to claim 3, wherein except for a surface of the first semiconductor layer covered by the supporting portion, remaining surfaces of the first semiconductor layer are all covered by the second semiconductor layer.

5. The semiconductor device according to claim 3, wherein an extent of a portion of the first semiconductor layer connected to the supporting portion in a longitudinal direction of the first semiconductor layer is less than a length of the first semiconductor layer in the longitudinal direction.

6. The semiconductor device according to claim 3, wherein the supporting portion comprises a laterally extending portion extending along a surface of the substrate and a vertically extending portion extending in a direction substantially perpendicular to the surface of the substrate, wherein the vertically extending portion extends onto vertical sidewalls of the first semiconductor layer which are substantially perpendicular to the surface of the substrate.

7. The semiconductor device according to claim 6, wherein the vertically extending portion of the supporting portion extends on the vertical sidewalls of the first semiconductor layer on opposite sides to sandwich the first semiconductor layer.

8. The semiconductor device according to claim 6, wherein,
the substrate comprises a protrusion at a position corresponding to the fin-shaped first semiconductor layer, a part of the vertically extending portion of the supporting portion extends along a surface of the protrusion, and a further part of the vertically extending portion of the supporting portion extends along the vertical sidewalls of the first semiconductor layer.

9. The semiconductor device according to claim 3, wherein the supporting portion is positioned at either one or both of opposite ends of the fin-shaped first semiconductor layer or is positioned in the middle of the fin-shaped first semiconductor layer.

10. The semiconductor device according to claim 3, wherein the supporting portion comprises a stack of oxide and nitride, and the isolation layer comprises oxide.

11. The semiconductor device according to claim 1, wherein the isolation layer fills a space between the first and second semiconductor layers and the substrate.

12. The semiconductor device according to claim 1, further comprising: a third semiconductor layer formed on a surface of the substrate and comprising the same material as that of the second semiconductor layer, wherein the isolation layer is formed on the third semiconductor layer.

13. The semiconductor device according to claim 1, wherein beneath the second semiconductor layer, the isolation layer is contiguous to the second semiconductor layer, while at remaining regions, the isolation layer has a top surface closer to the substrate than a bottom surface of the second semiconductor layer facing the substrate.

14. The semiconductor device according to claim 13, wherein the isolation layer has an undercut beneath the second semiconductor layer.

15. The semiconductor device according to claim 1, wherein the first semiconductor layer comprises Si, and the second semiconductor layer comprises Ge, SiGe, or a III-V compound semiconductor.

16. The semiconductor device according to claim 1, wherein the substrate comprises monocrystalline Si.

17. The semiconductor device according to claim 16, wherein the second semiconductor layer has a side surface approximately parallel to a (111) crystal plane family or a (110) crystal plane family of the substrate.

18. An electronic device comprising an integrated circuit formed by the semiconductor device according to claim 1.

19. The electronic device according to claim 18, further comprising: a display coupled to the integrated circuit and a wireless transceiver coupled to the integrated circuit.

* * * * *